United States Patent [19]
Tavis

[11] Patent Number: 5,189,380
[45] Date of Patent: Feb. 23, 1993

[54] INTEGRATED CIRCUIT FOR TRANSDUCERS

[75] Inventor: John R. Tavis, Mariposa, Calif.

[73] Assignee: Tavis Corporation, Mariposa, Calif.

[21] Appl. No.: 867,598

[22] Filed: Apr. 13, 1992

[51] Int. Cl.$^5$ ............................................. H03L 5/00
[52] U.S. Cl. ..................................... 331/109; 331/183
[58] Field of Search .................. 331/108 R, 109, 114, 331/183

[56] References Cited

U.S. PATENT DOCUMENTS

| | | | |
|---|---|---|---|
| 3,763,444 | 10/1973 | Tavis | 331/109 |
| 3,837,227 | 9/1974 | Tavis | 73/753 |
| 4,947,139 | 8/1990 | Tavis | 331/109 |

Primary Examiner—Robert J. Pascal
Attorney, Agent, or Firm—Christie, Parker & Hale

[57] ABSTRACT

The present invention comprises an oscillator including a transformer having a first winding with a power feed to the center tap. A first pair of transistors in a push-pull configuration are connected at the emitter electrodes across the second winding of the transformer. A center tap on the second winding is provided for a negative polarity power return. The base electrodes of the transistors are commonly connected to receive a control current and the collector electrodes of the transistors are connected across a first winding of the transformer. A capacitive element is connected across the first winding to create a tuned circuit within an oscillator.

17 Claims, 2 Drawing Sheets

INTEGRATED CIRCUIT FOR TRANSDUCERS

BACKGROUND OF THE INVENTION

1. Field of the Invention

This invention relates to sinusoidal oscillators, and, more particularly, the invention disclosed relates to cost-effective AC excitation of transducers using an integrated electronic circuit package which maintains controlled amplitude of the sinusoidal output of an oscillator circuit with an improved non-linearity correction circuit and a level shifting circuit.

2. Description of the Prior Art

Variable reluctance transducers and certain electrical devices require a highly efficient oscillator capable of producing constant amplitude output signals.

A prior art method used to eliminate non-linearity in transducers included circuitry applying across a net work, which has a non-linear function of variations in the physical parameters, an input signal of such a magnitude that a voltage signal developed across one of the series-connected impedance elements has a predetermined magnitude that is substantially unaffected by either variations in the variable impedance or in the output signal. This prior art technique is further discussed in U.S. Pat. No. 3,837,227 to Tavis.

Another method provided amplitude stability for a sinusoidal oscillator by improving low frequency noise rejection in the control circuit and using a differential amplifier in the negative feed back loop to retain the temperature insensitivity with a very low power consumption. This prior art is discussed in U.S. Pat. No. 4,947,139 to Tavis.

SUMMARY OF THE INVENTION

The present invention provides an integrated electronic circuit package for a sinusoidal oscillator with an improved non-linearity correction circuit and a level shifting circuit in the amplitude control circuit. The present invention also is flexible to operate with a wide range of DC excitation yet simple to allow fabrication in an integrated circuit device to reduce the cost of manufacture of high quality instruments.

The present invention comprises an oscillator including a transformer having a first winding with a power feed to the center tap. A first pair of transistors in a push-pull configuration are connected at the emitter electrodes across the second winding of the transformer. A center tap on the second winding is provided for a negative polarity power return. The base electrodes of the transistors are commonly connected to receive a control current and the collector electrodes of the transistors are connected across a first winding of the transformer. A capacitive element is connected across the first winding to create a tuned circuit within an oscillator.

The control current input for the first pair of transistors in the oscillator is derived through phase sensitive synchronous demodulation of the AC signal present across the first winding of the transformer. A second pair of transistors connected at their emitters and having base connections to opposite ends of the first winding provides rectification of the signal. Collector connections on the second pair of transistors are made to the opposite ends of the first winding from the base connections. A rectified control signal is thereby provided at the common output.

The rectified control signal is fed to a first input of an operational amplifier. A reference voltage from a level shifter, described infra, is provided to a second input of the operational amplifier which acts as a differential amplifier comparing the rectified control signal with the reference voltage and providing a corresponding voltage output. The voltage output of the operational amplifier is connected to the base of a fifth transistor for conversion to a control current. The emitter of the fifth transistor is connected to a current source and the collector is connected to the common base electrodes of the first pair of transistors in the oscillator to control the output voltage of the oscillator.

The characteristics of the second transistor pair in the demodulator provide for the significant noise rejection. One transistor or the other is fully coupled to the rectified output at all times. In addition, the transistors operate in a saturated condition, thereby having very low resistance, and the transistors conduct in both directions. Therefore, no instantaneous rectified noise signal can seriously modify the average detected signal in the transistors.

A fixed reference voltage and various adjustable voltages are applied to the inputs of a second operational amplifier henceforth referred to as the level shifter. The output of the level shifter is the control voltage for the oscillator amplifier. The second operational amplifier has one input connected to a DC reference voltage from a reference voltage circuit. A second input is normally connected through a voltage divider to the positive power supply rail and is further connected to the feedback output from a second demodulator. The second input modifies the voltage level of the level shifter according to the detection of signal level from the sensors. A selection provides a change of the output level of the level shifter by connecting the voltage divider to a negative rail of the power supply thereby causing a different voltage level at the second input. A second selection provides an alternative connection of the feedback output derived through the second demodulator to the first input of the operational amplifier. A reference voltage is thereby provided at the output of the level shifter.

The feedback control from the second demodulator to the level shifter is derived from a second phase sensitive demodulation of the AC signal present on an amplified signal of the sensors. The second demodulator comprises a third pair of transistors connected as common emitters and having collector connections to opposite ends of a first winding of a second transformer. The base connections on the third pair of transistors are made through voltage dividers to the ends of the first winding of the first transformer. The common output of the demodulator provides the feedback signal to the level shifter.

A third operational amplifier is used to amplify the AC output of the transducer. The amplifier gain is fixed so that the input to the third transistor pair is a function of the oscillator level and the value of two variable reluctance sensors. This AC amplifier eliminates the need for very stable DC amplifiers in the output stages. The second demodulator is necessary to improve the linearity of the output signal.

The second transformer is used to isolate the output of the AC amplifier from the output circuitry and provides signals which may be de-modulated for a DC output circuit through conventional means.

A DC reference voltage for the level shifter is generated from a conventional reference voltage circuit with a selection of regulated or un-regulated voltage sources.

DESCRIPTION OF THE PREFERRED EMBODIMENT

Figure 1:
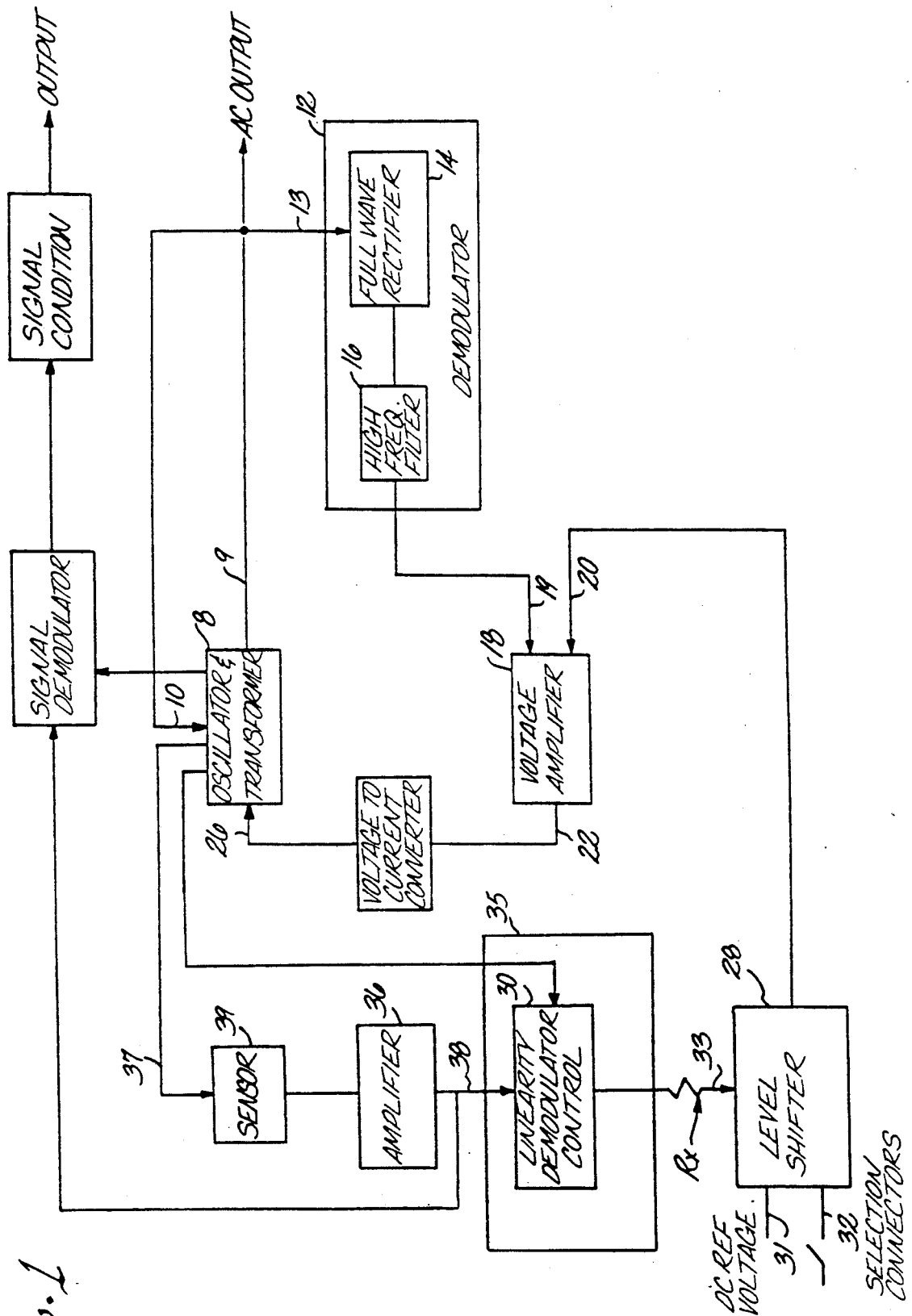
FIG. 1 is a block diagram of the integrated circuit for transducers.

A simplified block diagram of the present invention is provided in FIG. 1. An oscillator s provides a sinusoidal AC output on lead 9. An AC output, or a sinusoidal signal representing the AC output (described infra), is provided to a demodulator 12 on input 13. The demodulator 12 is comprised of a full wave rectifier 14 and a high frequency smoothing filter 16. A rectified and smoothed control signal is fed from the filter 16 to the amplifier 18 on lead 19. The amplifier 18 compares this signal to a DC reference voltage from a level shifter 28 provided on lead 20. A control current is provided at the output of the amplifier 22 for control of the oscillator through input 26. A positive feedback loop is provided from the output 9 of the oscillator to a second input 10 of the oscillator 8.

The AC output of the oscillator is also provided to a linearity circuit 35 on input 50. The linearity circuit 35 is comprised of a demodulator 30 receiving input from a sensor 39 through an amplifier 36. A low level signal from the sensor 39 is fed into one input of the operational amplifier 36. A drive signal from the amplifier 36 is provided to the demodulator 30 on lead 38. The rectified signal from the demodulator 30 then provides a controlled amount of feed back to the level shifter 28.

Linearity control is accomplished by feeding the output of the amplifier 36 to a second phase sensitive demodulator. The output of this demodulator is fed to the level shifter as a positive or negative signal to either increase or decrease the oscillation level as the transducer signal increases. Fine control is obtained by selecting the value of Rx to adjust the amount of feedback. Normally the feedback is between 1% and 10% of the reference voltage 31. The output of amplifier 36 is modified by the change in oscillator level in such a way to eliminate the non-linearity of the sensor. Thus the signal from the amplifier 36 becomes a more true representation of the applied pressure, acceleration, etc. The output of the level shifter 28 is the reference voltage for the amplifier 18 on lead 20.

A third demodulator 52 detects this signal and is then conditioned to provide the desired output from the circuit and sensor combination.

The integrated circuit incorporating the present invention as shown in the drawings develops an analogue of the input stimulus, e.g. pressure, acceleration, force or flow.

Figure 2:
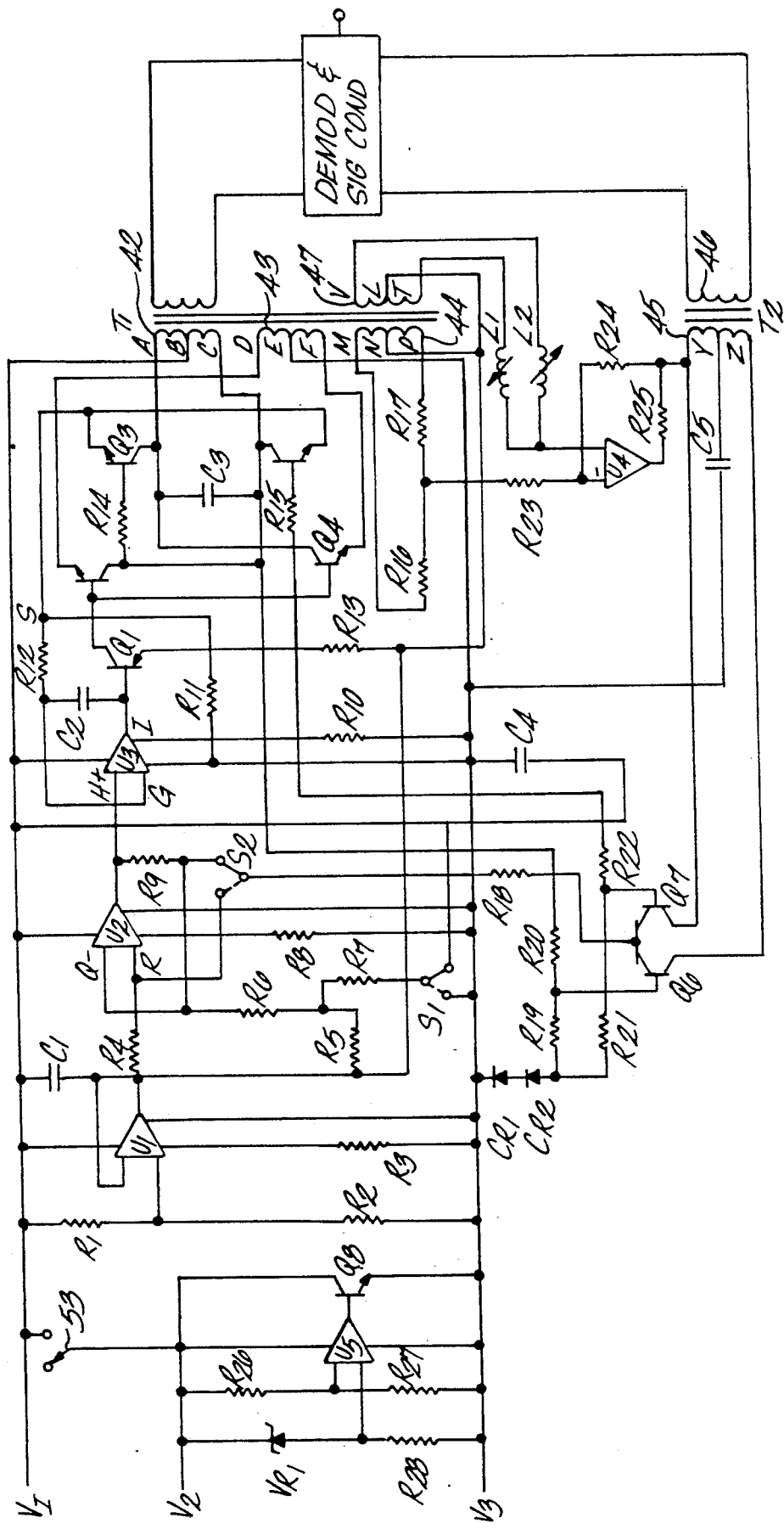
FIG. 2 is a detailed schematic diagram of the present invention.

Referring now to FIG. 2, the present embodiment of the invention has a transformer T1 having a first winding 42, a second winding 43, a third Winding 44, and a fourth winding 47. A first transistor pair Q2 and Q4 with emitter collector electrodes in a push-pull connection has the emitter of Q2 connected to output terminal D of the second winding and the emitter of Q4 connected to the output terminal F of the second winding. A center tap E on the second winding 43 provides a power return path through connection to a negative power supply terminal V3. Positive feedback is provided in the oscillator through the transformer by connection in proper phase of the collector electrode of transistor Q4 to the output terminal A of the first winding of transformer T1 and connection of the collector electrode of transistor Q2 to output terminal C of the first winding. DC excitation power to the oscillator is achieved through connection of the center tap B on the first winding 42 to a positive power supply terminal V1. The frequency of the oscillator is determined by the tuned circuit formed by a capacitor C3 and the first winding of transformer T1.

Amplitude control of the oscillator output is achieved by the negative feedback loop containing the demodulator 12 and the amplifier 18 of FIG. 1. Shown in FIG. 2 the demodulator comprises a second transistor pair Q3 and Q5. The second transistor pair Q3 and Q5 are both connected at the emitter electrodes to a common output S. The base of Q3 is connected through resistor R14 to terminal C of the first winding and the base of Q5 is connected through resistor R15 to terminal A of the first winding. The collector of Q3 is connected to terminal A of the first winding and the collector of Q5 is similarly connected to terminal C of the first winding.

The control signal from common output S is provided to the amplifier 18 of FIG. 1. Amplifier 18 includes an operational amplifier U3 and a transistor Q1 as shown in FIG. 2. The control signal from the demodulator is provided through resistor R12 to the operational amplifier U3 at pin G. Capacitor Cz effectively filters any high frequency ripple so that the voltage at pin I becomes a direct current voltage. A reference voltage generated by the level shifter 28 of FIG. 1 is connected to the operational amplifier U3 at pin H.

A second stage of the amplifier 18 comprises a transistor Q1. Transistor Q1 is incorporated into the circuit as an emitter follower. A control voltage is provided to the base electrode of transistor Q1 by the voltage controlled output at pin I of the operational amplifier U3. The emitter electrode of Q1 is connected to resistor R13. Current flows through resistor R13 and the emitter/collector circuit of Q1, increasing and decreasing consistent with bias changes on the base electrode. Resistor R13 acts as a load to convert the base voltage of transistor Q1 to a proportional collector current from a second voltage present on connection V4, which is the output of a reference voltage circuit to be described in greater detail subsequently. In alternate embodiments of the invention, a field-effect transistor (FET) can be used instead of Q1 and R13.

The collector electrode of transistor Q1 is connected to the base electrodes of both transistor Q2 and transistor Q4. This connection thereby provides a common bias for transistors Q2 and Q4 in the form of a control current, which increases or decreases in response to the voltage controlled output from the operational amplifier U3. This completes the negative feedback path for control of the oscillator 8.

Amplitude of the oscillator 8 is further dictated by the level shifter 28. The level shifter, as shown in FIG. 2 comprises an operational amplifier U2. A reference voltage is provided to the operational amplifier U2 at the input R through resistor R4. Gain of the amplifier is established by R9 in series with R6 and R5. However, since R5 and R7 originate at the same point, unless R7 or R18 are connected, the gain of the amplifier U2 is 1. Therefore the primary reference voltage at the input to U3 is the voltage established by the voltage divider, R1 and R2. R7 is normally an open circuit. However, if the oscillator level needs to be changed slightly, a resistor R7 is selected to accomplish this requirement. Connecting R7 to a minus voltage decreases oscillator level, and connecting R7 to a plus voltage increases oscillator level. This input is further connected to a voltage divider and the output of the second demodulator. The voltage divider including R5, R6 and R7, normally connected to a positive power supply rail at one end of R7, can be alternately connected to the negative power supply rail through selection connectors S1, which are implemented as jumper pads or other similar means, and effectively changes the voltage level to the second input of the level shifter. Second selection connectors S2 are utilized to change the connection of the feed back signal derived through the second demodulator to the first input of the level shifter.

The rectified feed back signal is generated from a second phase sensitive synchronous demodulator 30 of FIG. 1. As shown in FIG. 2, the second demodulator comprises a third transistor pair Q6 and Q7. The third transistor pair Q6 and Q7 are both connected at the emitter electrodes to common output W. The bases of Q6 and Q7 are driven through voltage dividers R20/R19 and R22/R21 from the C and A terminals of the first winding. Diodes CR1 and CR2 compensate for diode offset voltages of Q6 and Q7. The average voltage output of the linearity correction signal is one half the supply voltage and normally equal to the oscillator reference voltage. Only the signal developed through detection of the output of U4 is applied as a correction to the level shifter U2. The collector of Q6 is connected to terminal Z of the first winding of a second transformer T2 and the collector of Q7 is connected to terminal X of the first winding of the second transformer T2. The collector of Q7 is further connected to receive the amplified signal from an operational amplifier U4.

The first input of operational amplifier U4 is connected to resistor R23, and through R16 and R17 to the ends M and P respectively of the third Winding of the first transformer T1. R16 and R17 are zero balance resistors. A perfect matched pair of inducers would not need this balance correction. The second input of the operational amplifier U4 is connected through active sensors L1 and L2 to terminal U and T of the fourth winding of the first transformer T1. A detection of movements from the sensors is amplified to a low level signal and further rectified by the second demodulator before being fed back through the level shifter.

As an example of operation of the embodiment, for increased movement of the sensor the oscillation level should decrease to cause the output of the system to be linear with pressure applied. For example, as the pressure increases the output of the operational amplifier U4 will increase according to the deflection of the sensors. This signal is rectified by the demodulator 30 and provided to the level shifter 28 through resistor R18. This rectified signal is preferably connected to the non-inverting input of the operational amplifier U3 by selecting the connection to R4 instead of R9. It therefore increases the output of the level shifter. The level of oscillation is dependent on the difference of the reference voltage provided by the level shifter and the positive power supply level. In the example, positive DC voltage applied to the non-inverting input of the level shifter lowers the oscillation level; positive DC voltage applied to the inverting input increases the oscillation level. Conversely, applied negative voltages produce opposite effects. As the output of the level shifter is increased the difference of these two voltages will decrease effectively reducing the level of the oscillation and causing it to be linear.

As shown in FIG. 2, a selection of regulated and unregulated voltage sources is provided to supply different voltage for different circumstances. When an unregulated voltage source is preferred, a selection of selection connectors S3 will select the unregulated voltage source. An operational amplifier U1 with its voltage divider input provides the reference voltage output V4 to the first input of the level shifter and the voltage divider of the second input. Its output V4 also provides a reference voltage to the transistor Q1 through R13 to its emitter electrode and also to the center taps of the third winding and the fourth winding of the first transformer at terminals N and L respectively.

What is claimed is:

1. An integrated circuit for VR transducers comprising:
   a low power consumption amplitude stabilized oscillator circuit having
      a sine wave oscillator having a first transistor pair with emitter and collector electrodes connected in push-pull arrangement, with the emitter electrodes connected across a secondary winding of a transformer and with the collector electrodes connected across a primary winding of the transformer, and further having a capacitive element connected across the primary winding, the oscillator producing a sinusoidal output signal,
      a first synchronous full wave phase sensitive demodulator means connected to the oscillator for receiving sinusoidal signals representative of the amplitude of the output and producing a full wave DC rectified signal,
      a high frequency filter means connected to the first demodulator means for smoothing the rectified signal to provide a control voltage,
      an amplifier means connected to the filter means for comparing the control voltage to a reference voltage and producing a control signal output to the oscillator;
   a linearity circuit having
      a reference signal source connected across a secondary winding of the first transformer and producing a reference voltage,
      a sensor means having a variable transducer pair connected across a secondary winding of the first transformer and producing an output signal,
      an amplifier means connected to the sensor means for comparing the output signal and a reference voltage and producing an amplified signal;
   a second synchronous full wave phase sensitive demodulator means for producing a full wave DC rectified signal proportional to the amplified signal;
   a reference voltage means; and
   a level shifter means having
      an amplifier means connected to the second demodulator means for comparing the rectified signal to the DC reference voltage and producing a modifying control signal output to the oscillator circuit.

2. A device as defined in claim 1 in which a first synchronous full wave phase sensitive demodulator means comprises a second switching transistor pair with emitter and collector electrodes connected in push-pull arrangement.

3. A device as defined in claim 1 in which a second synchronous full wave phase sensitive demodulator means comprises a third switching transistor pair with emitter electrodes commonly connected, and one collector electrode connected to the amplifier means for receiving the amplified signal and both collector electrodes connected across a primary winding of a second transformer, and base electrodes connected to the oscillator for receiving sinusoidal signals representative of the amplitude of the output signal.

4. A device as defined in claim 2 in which a second synchronous full wave phase sensitive demodulator means comprises a third switching transistor pair with emitter electrodes commonly connected, and one collector electrode connected to the amplifier means for receiving the amplified signal and both collector electrodes connected across a primary winding of a second transformer, and base electrodes connected to the oscillator for receiving sinusoidal signals representative of the amplitude of the output signal.

5. A device as defined in claim 1 in which the amplifier means comprises an operational amplifier having a first input connected to the reference voltage, a second input connected to the filter means and a biasing signal output, and a single transistor having the base electrode connected to receive the biasing output, the emitter electrode connected to a current source and the collector electrode connected to the oscillator as the control signal output for control of the oscillator.

6. A device as defined in claim 1 in which the second pair of transistors in the full wave demodulator means are each configured in a common emitter circuit with the collector electrodes connected to receive the sinusoidal signals representative of the amplitude of the oscillator output signal, and base electrodes connected to receive the sinusoidal signals with reverse polarity and sufficient amplitude to alternatively drive each transistor of the second pair into saturation, the emitter electrodes of the second transistor pair further being commonly connected to supply a rectified control signal.

7. A device as defined in claim 1 in which the amplifier means comprises an operational amplifier having a first input connected to the reference voltage being connected across a secondary winding of the first transformer, and a second input connected to the sensor means and producing an amplified signal.

8. A device as defined in claim 1 in which the third pair of transistors in the full wave demodulator means are each configured in a common emitter circuit with collector electrodes connected across a primary winding of the second transformer and to the amplifier means to receive sinusoidal signals representative of the output level of the sensor means, and the base electrodes connected to the oscillator to receive the sinusoidal signals and sufficient amplitude to alternatively drive each transistor of the third transistor pair into saturation, the emitter electrodes of the third pair commonly connected to supply a rectified control signal.

9. A device as defined in claim 1 in which the level shifter means comprises an operational amplifier having a first input connected to a first reference voltage and a second input connected to the demodulator means and further connected to a second reference voltage, and a first selection to provide an alternative connection for the demodulator to the first input of the operational amplifier, and a second selection to provide an alternative connection and different level for the second reference voltage to the second input of the operational amplifier.

10. An improved control circuit for a stabilized sinusoidal oscillator having a sinusoidal signal input and output terminals for a shiftable reference voltage, the improvement comprising:
 a linearity circuit having
  a sensor means including a variable transducer pair to detect movement and produce the low level sinusoidal signal,
  an amplifier having a first input connected to a reference voltage, and a second input connected to the sensor means to receive the sinusoidal signal representative the detection level and an output for an amplified control signal,
  a signal demodulator having a full wave rectifier means including push-pull transistor elements to receive and rectify the full sinusoidal signal and the amplified control signal, and an output for a rectified control signal; and
 a level shifter having
  an operational amplifier having a first input connected to a first reference voltage, a second input connected to the output of the demodulator means and further connected to a second reference voltage, and
 means having
  a first selection to alter the connection of the output of the demodulator means to the first input of the operational amplifier, and
  a second selection to alter the connection and change the level of the second reference voltage to the second input of the operational amplifier, and
  a control signal output connected the input of the oscillator circuit.

11. A device as defined in claim 10 in which a reference voltage connected to the input of the operational amplifier of the level shifter has a reference voltage circuit with a selection of regulated and unregulated voltage sources.

12. An improved control circuit for a stabilized sinusoidal oscillator having a first transformer with primary winding input terminals, a primary winding center tap for positive power, secondary winding output terminals having a plurality of center taps, a secondary winding center tap for a power return, a secondary winding center tap for a positive power, and a second transformer with primary winding input terminals, a primary winding center tap of the second transformer for a power return, and a first transistor pair with emitter and collector electrodes in push-pull connection, and with the emitter electrodes connected to the secondary winding output terminals of the first transformer and the collector electrodes connected to the primary winding input terminals of the first transformer, and the base electrodes connected together to receive a control current, and a capacitive element connected across the primary winding input terminals of the first transformer, and a demodulator having a second transistor pair with emitter electrodes connected in common emitter configuration, and the collector electrodes connected to the primary winding input terminals of the first transformer, and the base electrodes connected to the primary winding input terminals of the first transformer with opposite polarity, and high frequency filter means connected to the collector electrodes of the second transistor pair for smoothing a control signal from the demodulator, and an amplifier having a first stage as a comparator with a first input connected to a reference voltage, a second input connected to the output of the filter means, and a control bias output, the amplifier having as a second stage a transistor with the base electrode connected to the control bias output, the emitter electrode connected to a current source, and the collector electrode connected to the control current input of the oscillator, the improvement comprising:

a linearity circuit having a sensor means including a variable transducer pair being connected to the secondary winding of the first transformer to detect movement and produce the low level sinusoidal signal, an amplifier having a first input connected to a reference voltage being further connected to the secondary winding of the first transformer, and a second input connected to the sensor means to receive the sinusoidal signal representative the detection level and producing an amplified control signal, a synchronous full wave sensitive demodulator having a third transistor pair with emitter electrodes connected in common emitter configuration, with the collector electrodes connected to the primary winding of a second transformer and one collector electrode further connected to the amplifier to receive the amplified control signal, the base electrodes connected to the oscillator circuit to receive the sinusoidal signals with sufficient amplitude to alternative drive each transistor of the third transistor pair into saturation, and producing a rectified control signal; and a level shifter having an operational amplifier having a first input connected to a first reference voltage, and a second input connected to the output of the demodulator and further connected to a second reference voltage including a voltage divider, and means having a first selection to alter the connection of the output demodulator means to the first input of the operational amplifier, and a second selection to alter the connection and change the level of the second reference voltage to the second input of the operational amplifier, and a control output signal to provide the reference voltage to the input of the oscillator circuit.

13. A device as defined in claim 12 in which a reference voltage connected to the input of the operational amplifier of the level shifter has a reference voltage circuit with a selection of regulated and unregulated voltage sources.

14. An improved control circuit for a stabilized sinusoidal oscillator having a first transformer with first winding input terminals, a first winding center tap for positive power, second winding output terminals, a second winding center tap for a power return, third winding output terminals, a third winding center tap for positive power, fourth winding output terminals, a fourth winding center tap for positive power; a second transformer with first winding input terminals, a first winding center tap of the second transformer for a power return; a first transistor pair with emitter and collector electrodes in push-pull connection, the emitter electrodes connected to the second winding output terminals of the first transformer and the collector electrodes connected to the first winding input terminals of the first transformer, and the base electrodes connected together to receive a control current; a capacitive element connected across the first winding input terminals of the first transformer; a demodulator having a second transistor pair with emitter electrodes connected in common emitter configuration, the collector electrodes connected to the first winding input terminals of the first transformer and the base electrodes connected to the first winding input terminals of the first transformer with opposite polarity; a high frequency filter means connected to the collector electrodes of the second transistor pair for smoothing a control signal from the demodulator; and, an amplifier having a first stage as a comparator with a first input connected to a reference voltage, a second input connected to the output of the filter means, and a control bias output, the amplifier having as a second stage a transistor with the base electrode connected to the control bias output, the emitter electrode connected to a current source, and the collector electrode connected to the control current input of the oscillator, the improvement comprising:

a linearity circuit having a sensor means including a variable transducer pair connected to the fourth winding of the first transformer to detect movement and produce a low level sinusoidal signal, an amplifier having a first input connected to a reference voltage and further connected to a third winding of the first transformer, and a second input connected to the sensor means to receive the sinusoidal signal representative of the detection level, the amplifier producing an amplified control signal, a synchronous full wave sensitive demodulator having a third transistor pair with emitter electrodes connected in common emitter configuration, with the collector electrodes connected to the first winding of a second transformer and one collector electrode further connected to the amplifier to receive the amplified control signal, the base electrodes connected to the oscillator circuit to receive the sinusoidal signals with sufficient amplitude to alternatively drive each transistor of the third transistor pair into saturation, the demodulator producing a rectified control signal; and a level shifter having an operational amplifier having a first input connected to a first reference voltage, and a second input connected to the output of the demodulator and further connected to a second reference voltage through a voltage divider, a first selection means to alter the connection of the output demodulator means to the first input of the operational amplifier, a second selection means to alter the connection and change the level of the second reference voltage to the second input of the operational amplifier, and a control output signal to provide the reference voltage to the input of the oscillator circuit.

15. A device as defined in claim 14 in which a reference voltage connected to the input of the operational amplifier of the level shifter has a reference voltage circuit with a selection of regulated and unregulated voltage sources.

16. A device as defined in claim 1 wherein the reference voltage means comprises:
- a regulated signal source providing constant DC reference voltage;
- an unregulated signal source providing an alternative source of reference voltage; and,
- means for selecting the regulating and the unregulating signal source and providing constant DC reference voltage.

17. An integrated circuit for VR transducers comprising:
- a low power consumption amplitude stabilized oscillator circuit having
  - a sine wave oscillator having a first transistor pair with emitter and collector electrodes connected in push-pull arrangement, with the emitter electrodes connected across a second winding of a transformer and with the collector electrodes connected across a first winding of the transformer, and further having a capacitive element connected across the first winding, the oscillator producing a sinusoidal output signal,
  - a first synchronous full wave phase sensitive demodulator means including a second switching transistor pair with emitter and collector electrodes connected in push-pull arrangement, connected to the oscillator for receiving sinusoidal signals representative of the amplitude of the output and producing a full wave DC rectified signal,
  - a high frequency filter means connected to the first demodulator means for smoothing the rectified signal to provide a control voltage,
  - an amplifier means connected to the filter means for comparing the control voltage to a reference voltage and producing a control signal output to the oscillator;
- a linearity circuit having
  - a reference signal source connected across a third winding of the first transformer and producing a reference voltage,
  - a sensor means having a variable transducer pair connected across a third winding of the first transformer and producing an output signal,
  - an amplifier means connected to the sensor means for comparing the output signal and a reference voltage and producing an amplified signal;
- a second synchronous full wave phase sensitive demodulator means including a third switching transistor pair with emitter electrodes commonly connected, and one collector electrode connected to the amplifier means for receiving the amplified signal and both collector electrodes connected across a first winding of a second transformer, and base electrodes connected to the oscillator for receiving sinusoidal signals representative of the amplitude of the output signals, and for producing a full wave DC rectified signal proportional to the amplified signal;
- a reference voltage means; and
- a level shifter means having
  - an amplifier means connected to the second demodulator means for comparing the rectified signal to the DC reference voltage and producing a modifying control signal output to the oscillator circuit,
  - means for selecting an alternative connection to the second demodulator means, and further selecting an alternative connection to a DC reference voltage.

* * * * *

UNITED STATES PATENT AND TRADEMARK OFFICE
CERTIFICATE OF CORRECTION

PATENT NO. : 5,189,380
DATED : February 23, 1993
INVENTOR(S) : John R. Tavis

It is certified that error appears in the above-indentified patent and that said Letters Patent is hereby corrected as shown below:

```
Column 1, lines 19,20, change "net work" to -- network --.
Column 1, line 31, change "feed back" to -- feedback --.

Column 3, line 14, after "oscillator" change "s" to -- 8 --.
Column 3, line 25, before "through" insert -- 8 --.

Column 4, line 30, change "Cz" to -- C2 --.

Column 5, line 40, change "Winding" to -- winding --.
Column 5, line 42, change "perfect" to -- perfectly --.
Column 5, line 42, change "inducers" to -- inductors --.

Column 8, line 14, after "representative" insert -- of --.
Column 8, line 35, after "connected" insert -- to --.

Column 9, line 19, after "representative" insert -- of --.
Column 9, line 31, change "alternative" to
         -- alternatively --.
```

Signed and Sealed this

Fourteenth Day of December, 1993

Attest:

BRUCE LEHMAN

*Attesting Officer*  *Commissioner of Patents and Trademarks*